United States Patent [19]
Nedwek

[11] Patent Number: 5,278,467
[45] Date of Patent: Jan. 11, 1994

[54] SELF-BIASING INPUT STAGE FOR HIGH-SPEED LOW-VOLTAGE COMMUNICATION

[75] Inventor: David J. Nedwek, Beaverton, Oreg.

[73] Assignee: Intel Corporation, Santa Clara, Calif.

[21] Appl. No.: 913,447

[22] Filed: Jul. 14, 1992

[51] Int. Cl.$^5$ .................... H03K 5/153; H03K 3/26
[52] U.S. Cl. ......................... 307/530; 307/355; 307/362; 307/279
[58] Field of Search ............. 307/530, 355, 359, 491, 307/494, 362, 272.2, 279

[56] References Cited

U.S. PATENT DOCUMENTS

| | | | |
|---|---|---|---|
| 3,983,412 | 9/1976 | Roberts et al. | 307/530 |
| 4,740,714 | 4/1988 | Masaki et al. | 307/279 |
| 4,769,564 | 9/1988 | Garde | 307/279 |
| 4,937,476 | 6/1990 | Bazes | 307/475 |
| 5,223,753 | 6/1993 | Lee et al. | 307/355 |

*Primary Examiner*—William L. Sikes
*Assistant Examiner*—Toan Tran
*Attorney, Agent, or Firm*—Blakely, Sokoloff, Taylor & Zafman

[57] ABSTRACT

A circuit that includes a self-biased differential amplifier a level restore circuit. The output of the differential amplifier is coupled to the source pins of a p type transistor and an n type transistor. The output of the differential amplifier is further coupled to a first inverter circuit that provides feedback to the gates of the p and n type transistors. The first inverter also further amplifies the output voltage of the differential amplifier. When the differential amplifier outputs a high voltage, the p transistor attempts to drain the output and pull the output voltage down. When the differential amplifier begins switching from a high voltage to a low voltage, the p transistor accelerates the voltage swing and decreases the propagation delay of the buffer circuit. Likewise, when the differential amplifier swings from a low voltage to a high voltage, the n transistor reduces the propagation delay of the voltage swing.

10 Claims, 1 Drawing Sheet

SELF-BIASING INPUT STAGE FOR HIGH-SPEED LOW-VOLTAGE COMMUNICATION

BACKGROUND OF THE INVENTION

1. Field of the Invention

The present invention relates to a differential amplifier that can be used as an input buffer.

2. Description of Related Art

Data rates of communication busses continually increase with each new generation of processors. Present computer designs include a bus data rate of approximately 500 megabits per second (Mbits/sec). Data rates of 500 Mbits/sec are difficult to achieve using standard circuit designs because of the parasitic capacitance of the bus board. To overcome the physical limitations of the board, systems of such speed are typically designed to have a low voltage swing (the difference in voltage between a binary "1" and a binary "0"). The low voltage swing can be on the order of 600mV peak to peak.

Most memory and logic circuits operate in the 2-5 V range. Utilizing a high speed/low voltage swing bus with conventional electronic devices, typically requires an input buffer to increase the voltage of the signal from the bus to the devices.

Input buffers of the prior art have often incorporated a differential amplifier which amplifies the difference between the signal and a reference voltage. Most differential amplifier designs are particularly sensitive to fluctuations in temperature or voltages. Variations in the temperature or voltages, can lead to errors in the switching of the amplifier.

U.S. Pat. No. 4,937,476 issued to Bazes discloses an input buffer that utilizes a self-biased differential amplifier. The differential amplifier has a first pair of complementary n and p type FETs coupled to the input signal, and a second pair of complementary n and p type FETs coupled to a reference voltage. The first and second pair of FETs are coupled to a supply voltage that is controlled by a third pair of complementary FETs. The drain pins of the first set of FETs are connected to the gates of the third set of FETs, to create a negative feedback within the amplifier. The bias voltage of the first FETs is set at the midpoint of the active region. If the bias voltage moves from the midpoint, the feedback from the first FETs to the third FETs will vary the supply voltage so that the bias voltage is returned to the center of the active region. Any variations in temperature or voltage are therefore compensated through the self-biasing scheme incorporated into the Bazes design.

To provide an input buffer that can operate at high frequencies, it is desirable to minimize the propagation delays and increase the slew rate of the buffer. Additionally, the propagation delay from the high to low voltage swing is typically different from the propagation delay between the low to high voltage swing. The designer must typically compensate for the skew between the propagation delays. Although the Bazes circuit provides a self-biasing feature, the slew rate and skew between the propagation delays for the Bazes differential amplifier is somewhat unacceptable for usage with a data rate on the order of 500 Mbits/sec. It would therefore be desirable to have a circuit which can provide an input buffer that has an increased slew rate and minimal propagational skew, so that the circuit can be used with a high speed/low voltage swing bus.

SUMMARY OF THE INVENTION

The present invention is a circuit that includes a self-biased differential amplifier connected to a level restore circuit. The differential amplifier has a first pair of complementary n and p type transistors coupled to an input signal, and a second pair of complementary n and p type transistors coupled to a reference voltage. The first and second pairs of transistors are connected to a supply voltage that is controlled by a third pair of complementary n and p type transistors. The drain pins of the first set of transistors are connected to the gates of the third set of transistors, to provide feedback to the third transistors and control the supply voltage of the differential amplifier. The feedback provides a self-biasing scheme that substantially immunizes the differential amplifier from variations in the temperature or voltages of the circuit.

The output of the differential amplifier is coupled to the source pins of a p type transistor and an n type transistors. The output of the differential amplifier is further coupled to a first inverter circuit that provides feedback to the gates of the p and n type transistors. The first inverter also further amplifies the voltage output of the differential amplifier. When the differential amplifier outputs a high voltage, the p transistor attempts to drain the output and pull the output voltage down. When the differential amplifier begins switching from a high voltage to a low voltage, the p transistor accelerates the voltage swing and decreases the propagation delay of the buffer circuit. Likewise, when the differential amplifier swings from a low voltage to a high voltage, the n type transistor reduces the propagation delay of the voltage swing. The circuit is constructed so that the skew between the high to low and low to high propagation delays is minimized. The reduction in the propagation skew and increase in the slew rate of the circuit allows the input buffer of the present invention to be used with high speed bus rates.

Therefore it is an object of the present invention to provide a differential amplifier circuit that increases the slew rate of amplifiers in the prior art.

It is also an object of the present invention to provide a differential amplifier that reduces the propagation skew of amplifiers in the prior art.

It is also an object of the present invention to provide an input buffer that can be used with a high speed/low voltage swing bus.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
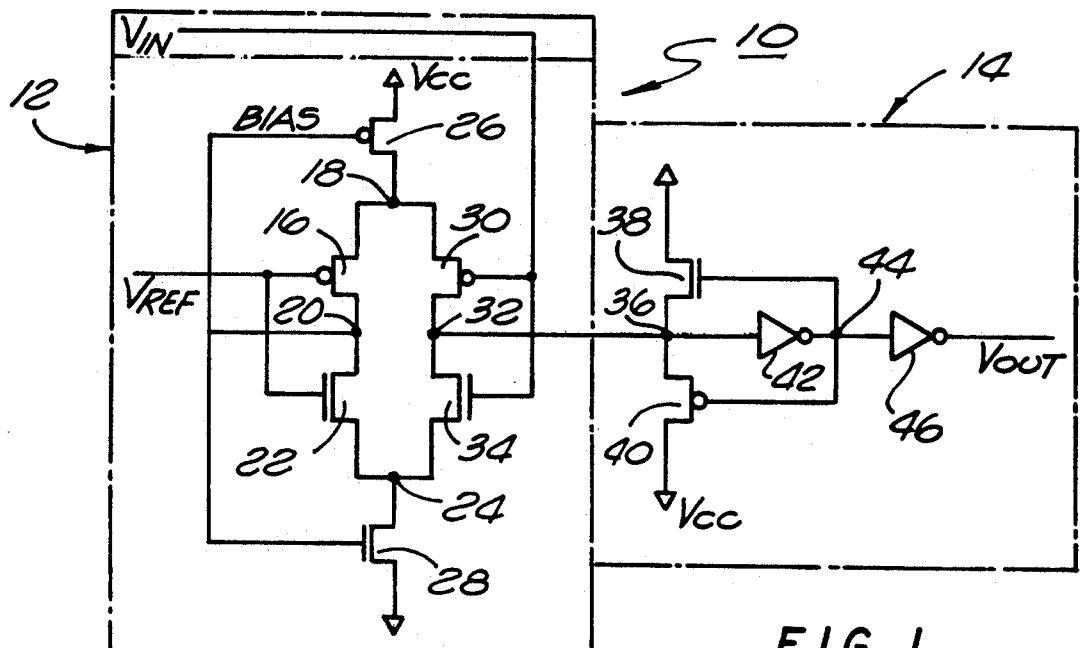
FIG. 1 is a schematic of a circuit of the present invention.

Referring to the drawings more particularly by reference numbers, FIG. 1 shows a circuit 10 of the present invention. The circuit 10 can be used as an input buffer between boards or components that operate at different voltage levels. In the preferred embodiment, the circuit 10 is used as an input buffer between a bus and a memory card. The bus may provide digital signals at a data rate of 500 megabits per second (Mbits/sec) with a peak to peak voltage swing of 0.6 volts (V). The memory card may contain CMOS devices that operate in the 5 V range. The circuit 10 amplifies the signals received from the bus so that the signals can be used on a chip. Although the circuit 10 has been described as an input buffer between a bus and a chip, it is to be understood that the circuit 10 may be used in any manner.

The circuit 10 includes a differential amplifier 12 and a level restore circuit 14. The differential amplifier 12 provides an output voltage that is based on the difference between a first input voltage and a second input voltage. The first input voltage is usually a fixed reference voltage (VREF) and the second input voltage is typically an input signal (VIN) coming from a bus, card, device, etc. The level restore circuit 14 reduces the propagation delays of the rail to rail transitions of the amplifier 12. The reduction in propagation delays provides a differential amplifier that can effectively run at data rates on the order of 500 Mbits/sec. The level restore circuit 14 also amplifies the output voltage of the differential amplifier and reduces the propagation skew of the voltage swings.

The differential amplifier 12 has a first transistor 16 that has a source pin connected to a first node 18, a drain pin connected to a second node 20 and a gate pin connected to a line that provides the reference voltage VREF. The reference voltage is typically connected to a source which provides a constant voltage. The first transistor 16 is of the p type and is preferably a CMOS device.

The amplifier 12 also has a second transistor 22 that has a drain pin connected to the second node 20, a source pin connected to a third node 24 and a gate pin connected to the reference voltage VREF. The second transistor 22 is of the n type and is preferably a CMOS device.

The drain pins of the first 16 and second 22 transistors are coupled to the gates of third 26 and fourth 28 transistors. The third transistor 26 is preferably a p type CMOS device with a drain pin connected to the first node 18 and the source pin connected to a supply voltage such as VCC. The fourth transistor 28 is preferably a n type CMOS device that has a drain pin connected to the third node 24 and a source pin connected to VSS, which is typically ground.

The amplifier circuit 12 includes a fifth transistor 30 that has a drain pin connected to a fourth node 32, a source pin connected to the first node 18 and a gate connected to a line that provides an input voltage VIN. The circuit 12 also contains a sixth transistor 34 that has a drain pin connected to the fourth node 32, a source pin connected to the third node 24 and a gate that is also coupled to VIN. The fifth 30 and sixth 34 transistors are p and n types, respectively. The transistors 30 and 34 are preferably CMOS devices. The fourth node 32 provides the output for the differential amplifier.

The size of the transistors 16, 22, 30 and 34 are such that the transistors are biased in the center of their active regions when operating under ideal voltage and temperature conditions. Changes in operating conditions may cause the bias point of the transistors to deviate from the midpoint of the active regions. When this event occurs, the second node 20 provides a negative feedback to the transistors 26 and 28, which vary the supply voltage and move the bias voltage back toward the center of the active region. The transistors 30 and 34 have the same electrical characteristics as the transistor pair 16 and 22, so that when VIN equals VREF, the transistors 30 and 34 will become biased in the same manner as transistors 16 and 22. The self-biasing scheme compensates for changes in the operating conditions of the circuit and insures that the transistors 16, 22, 30 and 34 are always operating in the active region.

When VIN makes a transition from a low state to a high state, the output voltage of the amplifier (voltage at node 32) changes from a high state to a low state. The center of the switching region is typically at or near the point where VIN equals VREF. This value is preferably VCC/2.

The fourth node 32 is connected to a fifth node 36 located within the level restore circuit 14. The circuit 14 has an n type transistor 38 with a source pin connected to the fifth node 36 and a drain pin coupled to VSS which is typically ground. The circuit 14 also has a p type transistor 40 with a source pin connected to the fifth node 6 and a drain pin coupled to a voltage source such as VCC. The n and p type transistors are preferably CMOS devices.

The level restore circuit 14 includes a first inverter 42 with an input connected to the fifth node 36 and an output connected to a sixth node 44. The first inverter 42 inverts and amplifies the output signal of the differential amplifier 12. The circuit 14 also has a second inverter 46 connected to the sixth node 44. The second inverter 46 inverts the output signal of the first inverter 42 and provides a buffer between the circuit 10 and the output of the circuit 10. The inverters 42 and 46 typically each include an n type transistor and a complementary p type transistor.

In operation, when the output voltage at node 36 is at a high state, the first inverter 42 provides a low state signal to the p type transistor 40. The low input signal to the p type transistor 40 opens the device such that the transistor 40 tries to drain and pull down the output voltage at node 36. The differential amplifier 12 is sized to overcome the pull of the transistor 40 so that the p transistor 40 does not change the output voltage of the circuit 10. In this state, the n type transistor 38 is turned off and has essentially no effect on the output voltage. When the differential amplifier 12 begins switching from the high state to a low state, the p transistor 40 assist in pulling down the output voltage and reducing the propagation delay of the voltage swing. As the output voltage ramps down to the low state, the first inverter 42 is providing a continually increasing voltage to the p transistor 40, eventually turning off the device 40. At the same time, the output of the inverter 42 is turning on the n type transistor 38. The first inverter 42 preferably switches at a value less then VCC/2.

When the output voltage of the differential amplifier reaches the low state, the n type transistor 38 tries to pull up the output voltage at node 36. The amplifier 12 is again sized so that the transistor 38 does not change the output voltage of the circuit 10. When the differential amplifier 12 begins changing from the low state to a high state, the n type transistor 38 assist in pulling up the output voltage to reduce the propagation delay of the voltage swing.

Figure 2:
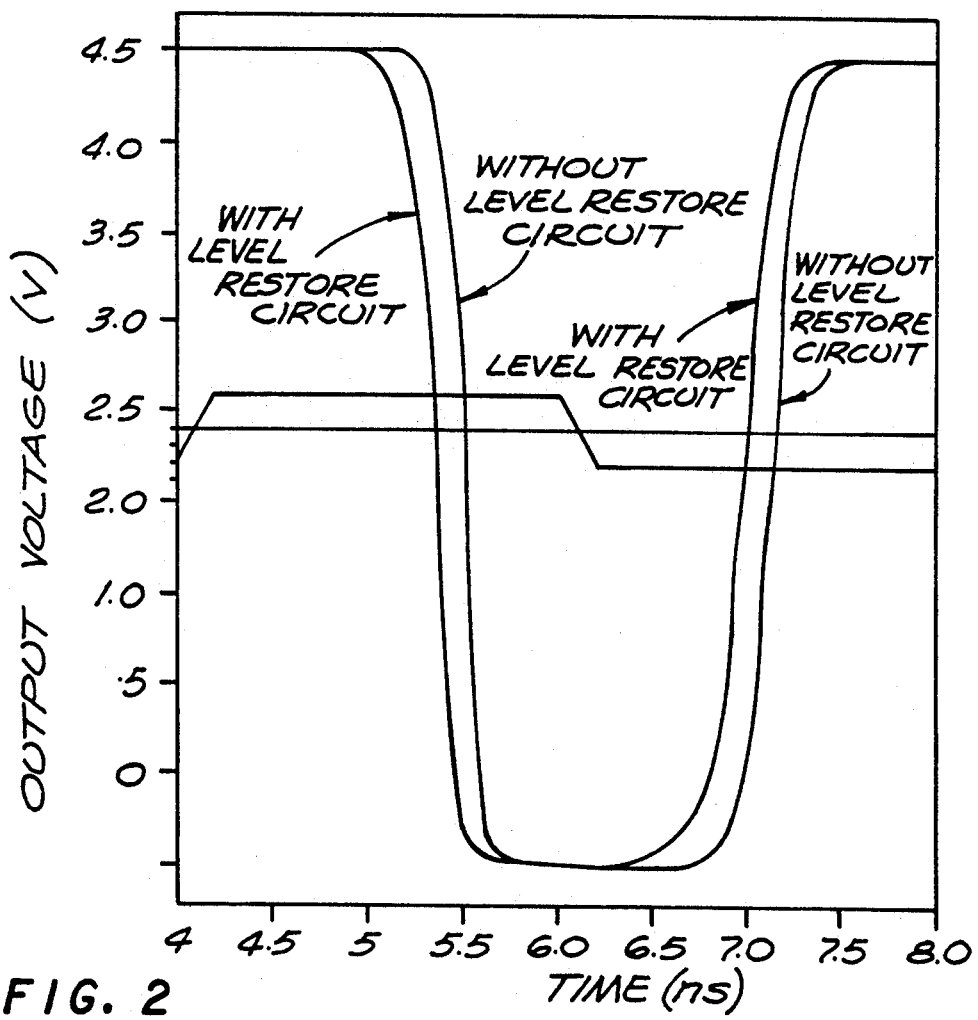
FIG. 2 is a graph showing the output voltage of the circuit with and without the level restore circuit of the present invention.

FIG. 2 is a graph of the output voltage of the circuit 10 as a function of time. As shown by the graph, the addition of the level restore circuit 14 increases the slope of the voltage swings and thus decreases the propagation delays and slew time of the rail to rail transitions. The circuit 10 is also constructed to reduce the skew between the high to low propagation delay and the low to high propagation delay.

In the preferred embodiment, the p type transistors 16 and 30 have channel dimensions of 30 microns by 1.1 microns, the n type transistors 22 and 34 have dimensions of 15 by 1.1 microns, the transistor 26 is 20 by 0.9 microns and the transistor 28 is 10 by 0.9 microns. Both the n and p type transistors 38 and 40 of the level restore circuit 16 have channel dimensions of 5 by 0.9 microns. The p and n transistors of the first inverter 42 have dimensions of 7×0.9 and 5×0.9 microns, respectively. The dimensions of the p and n transistors of the second inverter 44 are 16×0.9 microns and 8×0.9 microns, respectively.

Using the above described physical circuit characteristics and providing input signals (VIN) at a data rate of approximately 500 Mbits/sec, it has been calculated that the propagation delays are reduced approximately 200 picoseconds and the skew between the high to low and low to high is reduced to approximately 25 picoseconds. The present invention thus provides a circuit that can provide an input buffer that reduces the delay, slew and skew of rail to rail voltage swings. The circuit 10 is particularly useful as an input buffer for high speed/low voltage swing signals.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit, comprising:
   differential amplifier circuit means for providing a first output voltage at a first node based on a difference between a first input voltage and a second input voltage;
   a p-type transistor having a source pin connected to said first node, and a gate;
   a n-type transistor having a source pin connected to said first node, and a gate;
   first inverter circuit means having an input operatively connected to said first node and an output connected to said gates of said n and p type transistors, for inverting said first output voltage and producing a second output voltage, said first inverter circuit means further providing feedback to said n and p type transistors.

2. The circuit as recited in claim 1, further comprising second inverter circuit means operatively connected to said first inverter circuit means for inverting said second output voltage and providing a third output voltage.

3. The circuit as recited in claim 1, wherein said p-type transistor has the same circuit characteristics as said n-type transistor.

4. The circuit as recited in claim 1, wherein said differential amplifier switches at a voltage approximately equal to one-half of a supply voltage provided to said differential amplifier and said first inverter circuit means switches at a voltage less than one-half of a supply voltage provided to said first inverter circuit means.

5. The circuit as recited in claim 1, wherein said differential amplifier means includes;
   a first transistor connected to a second node and a third node, said first transistor having a gate coupled to said first input voltage;
   a second transistor connected to said third node and a fourth node, said second transistor having a gate coupled to said first input voltage;
   a third transistor connected to said second node and a supply voltage, said third transistor having a gate coupled to said third node;
   a fourth transistor connected to said fourth node and said supply voltage, said third transistor having a gate coupled to said third node;
   said first and second transistors are constructed to operate in an active region and provide a biasing voltage at said third node, said biasing voltage being coupled to said gates of said third and fourth transistors to provide a negative feedback to said first and second transistors at said second and fourth nodes such that said first and second transistors are maintained in said active region;
   a fifth transistor coupled to said second node and a fifth node, said fifth transistor having a gate coupled to said second input voltage;
   a sixth transistor coupled to said fourth node and said fifth node, said sixth transistor having a gate coupled to said second input voltage, said fifth node being coupled to said first node.

6. The circuit as recited in claim 5, wherein said first, third and fifth transistors are p-type devices and said second, fourth and sixth transistors are n-type devices.

7. A circuit, comprising:
   a first transistor connected to a first node and a second node, said first transistor having a gate coupled to a first input voltage;
   a second transistor connected to said second node and a third node, said second transistor having a gate coupled to said first input voltage;
   a third transistor connected to said first node and a first supply voltage, said third transistor having a gate coupled to said second node;
   a fourth transistor connected to said third node and first said supply voltage, said third transistor having a gate coupled to said second node;
   said first and second transistors are constructed to operate in an active region and provide a biasing voltage at said second node, said biasing voltage being coupled to said gates of said third and fourth transistors to provide a negative feedback to said first and second transistors at said first and third nodes such that said first and second transistors are maintained in said active region;
   a fifth transistor coupled to said first node and a fourth node, said fifth transistor having a gate coupled to a second input voltage;
   a sixth transistor coupled to said third node and said fourth node, said sixth transistor having a gate coupled to said second input voltage, said fourth node providing a first output voltage;
   a p-type transistor having a source pin coupled to said fourth node, a drain pin connected to a second supply voltage, and a gate;
   a n-type transistor having a source pin coupled to said fourth node, a drain pin coupled to said second supply voltage, and a gate;
   first inverter circuit means having an input connected to said fourth node and an output connected to said gates of said n and p type transistors, for inverting said first output voltage and producing a second output voltage, said first inverter circuit means further providing feedback to said n and p type transistors; and, second inverter circuit means operatively connected to said first inverter circuit means for inverting said second output voltage and providing a third output voltage.

8. The circuit as recited in claim 7, wherein said p-type transistor has the same circuit characteristics as said n-type transistor.

9. The circuit as recited in claim 8, wherein said fifth and sixth transistors switch at a voltage approximately equal to one-half of said first supply voltage provided to said transistors and said first inverter circuit means switches at a voltage less than one-half of said second supply voltage provided to said first inverter circuit means.

10. The circuit as recited in claim 9, wherein said first, third and fifth transistors are p-type devices and said second, fourth and sixth transistors are n-type devices.

* * * * *